US008916811B2

(12) United States Patent
Miller et al.

(10) Patent No.: US 8,916,811 B2
(45) Date of Patent: Dec. 23, 2014

(54) INTEGRATED ELECTRONICS HOUSING FOR A SOLAR ARRAY

(75) Inventors: Wayne Miller, Los Altos, CA (US); Hossein Kazemi, San Francisco, CA (US); Brian Hinman, Los Gatos, CA (US)

(73) Assignee: Western Gas and Electric Company, West Lake Village, CA (US)

( * ) Notice: Subject to any disclaimer, the term of this patent is extended or adjusted under 35 U.S.C. 154(b) by 714 days.

(21) Appl. No.: 13/227,652

(22) Filed: Sep. 8, 2011

(65) Prior Publication Data

US 2012/0072041 A1 Mar. 22, 2012

Related U.S. Application Data

(63) Continuation-in-part of application No. 13/028,122, filed on Feb. 15, 2011, now Pat. No. 8,618,456.

(60) Provisional application No. 61/424,537, filed on Dec. 17, 2010, provisional application No. 61/424,515, filed on Dec. 17, 2010, provisional application No. 61/424,518, filed on Dec. 17, 2010, provisional application No. 61/424,493, filed on Dec. 17, 2010, provisional application No. 61/338,313, filed on Feb. 16, 2010, provisional application No. 61/424,537, filed on Dec. 17, 2010, provisional application No. 61/343,070, filed on Apr. 23, 2010.

(51) Int. Cl.

| G01J 1/44 | (2006.01) |
| G01S 19/14 | (2010.01) |
| F24J 2/54 | (2006.01) |
| H01L 31/042 | (2014.01) |
| H01L 31/02 | (2006.01) |
| F24J 2/38 | (2014.01) |
| G01S 3/786 | (2006.01) |

(52) U.S. Cl.
CPC ............ *H01L 31/0422* (2013.01); *G01S 19/14* (2013.01); *Y02E 10/47* (2013.01); *F24J 2/5424* (2013.01); *Y02E 10/52* (2013.01); *G01S 3/7861* (2013.01); *H01L 31/02021* (2013.01); *F24J 2/38* (2013.01)
USPC ............................ 250/203.4; 307/45; 363/71

(58) Field of Classification Search
USPC .............. 250/203.4, 239; 363/16, 40, 55, 71; 307/45, 52, 77, 82; 136/243–244
See application file for complete search history.

(56) References Cited

U.S. PATENT DOCUMENTS

| 6,404,655 | B1 * | 6/2002 | Welches ......................... 363/41 |
| 6,914,418 | B2 * | 7/2005 | Sung .............................. 320/140 |
| 7,053,506 | B2 * | 5/2006 | Alonso et al. ................. 307/126 |
| 7,456,524 | B2 * | 11/2008 | Nielsen et al. .................. 307/82 |

* cited by examiner

*Primary Examiner* — Seung C Sohn
(74) *Attorney, Agent, or Firm* — Rutan & Tucker, LLP (57) ABSTRACT

An integrated electronics housing contains both system electronics and power generation circuits for a two-axis tracker assembly having a CPV solar array. The housing contains at least a communication bus, motion control circuits, and inverter circuits, and acts as the local system control point for that tracker mechanism. The inverter circuits generate three-phase AC voltage that is supplied to a grid interface transformer. Each inverter receives a bipolar DC voltage supplied from its own set of CPV cells. The motion control circuits move the CPV cells of the tracker mechanism to angular coordinates resulting from a solar tracking algorithm. The communication bus connects to the motion control circuits and the inverter circuits to facilitate communications of information, including parameters of power being generated by the inverter circuits, between the motion control circuits and the AC inverter circuits to fine tune the AC power generated out of the tracker mechanism.

20 Claims, 10 Drawing Sheets

INTEGRATED ELECTRONICS HOUSING FOR A SOLAR ARRAY

RELATED APPLICATIONS

This application is a continuation in part of and claims the benefit of and priority to U.S. Provisional Application titled "Integrated electronics system" filed on Dec. 17, 2010 having application Ser. No. 61/424,537, U.S. Provisional Application titled "Two axis tracker and tracker calibration" filed on Dec. 17, 2010 having application Ser. No. 61/424,515, U.S. provisional application titled "ISIS AND WIFI" filed on Dec. 17, 2010 having application Ser. No. 61/424,493, and U.S. Provisional Application titled "Photovoltaic cells and paddles" filed on Dec. 17, 2010 having application Ser. No. 61/424,518, and this application is a continuation in part of and claims the benefit of and priority to U.S. non-provisional application titled "an inverter for a three-phase AC photovoltaic system" filed on Feb. 15, 2011 having application Ser. No. 13/028,122, which itself claim priority under 35 USC 119(e) to U.S. Provisional Application titled "Single stage dc-to-ac conversion for high efficiency operation of concentrating photovoltaic systems" filed on Feb. 16, 2010 having application Ser. No. 61/338,313 and U.S. Provisional Application titled "Integrated electronics system" filed on Dec. 17, 2010 having application Ser. No. 61/424,537, and U.S. Provisional Application titled "Solar cell substring grounding to manage inverter input voltage" filed on Apr. 23, 2010 having application Ser. No. 61/343,070.

FIELD

In general, a photovoltaic system having a two-axis tracker assembly for a photovoltaic system is discussed.

BACKGROUND

A two-axis tracker may break up its solar array for more efficient operation. A two axis tracker may be designed for easier of installation in the field.

SUMMARY

Various methods and apparatus are described for a photovoltaic system. In an embodiment, an integrated electronics housing contains both system electronics and power generation circuits for a two-axis tracker assembly that has a Concentrated PhotoVoltaic (CPV) solar array. The integrated electronics housing contains at least a communication bus, motion control circuits, and inverter circuits, and acts as the local system control point for that two-axis solar tracker mechanism. One or more Alternating Current (AC) inverter circuits with switching devices generate three-phase AC voltage that is supplied to a utility power grid interface transformer. Each inverter receives a bipolar DC voltage supplied from its own set of CPV cells. One or more motion control circuits move the CPV cells of the two-axis solar tracker mechanism to a determined angular coordinates resulting from an offset value being applied to a results of an Ephemeris calculation of a solar tracking algorithm. A backplane communication bus connects to the motion control circuits and the inverter circuits to facilitate communications of information, including parameters of power being generated by the inverter circuits, between the motion control circuits moving the CPV cells and the AC inverter circuits to fine tune an AC power generated out of the two axis tracker mechanism.

BRIEF DESCRIPTION OF THE DRAWINGS

The multiple drawings refer to the embodiments of the invention.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific cells, named components, connections, types of connections, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Further specific numeric references such as a first inverter, may be made. However, the specific numeric reference should not be interpreted as a literal sequential order but rather interpreted that the first inverter is different than a second inverter. Thus, the specific details set forth are merely exemplary. The specific details may be varied from and still be contemplated to be within the spirit and scope of the present invention.

In general, many aspects are discussed associated with an integrated electronics system for operating a multi-axis solar power array including: 1) the integrated electronics system includes circuits such as motion control, inverters, ground fault circuits, communications, GPS, switch gear, interconnects, power supply, etc. in a local system control point for operating the multi-axis solar power array; 2) the integrated electronics housing has two or more chambers including a NEMA-4 chamber (inside sealed from environment) and Nema-3 chamber (exposed to the outside to allow cooling); 3) the circuitry has integrated performance monitoring points embedded; 4) integration of weather station data occurs through a high speed interface; and many other aspects are discussed and illustrated.

Figures 1A, 1B:
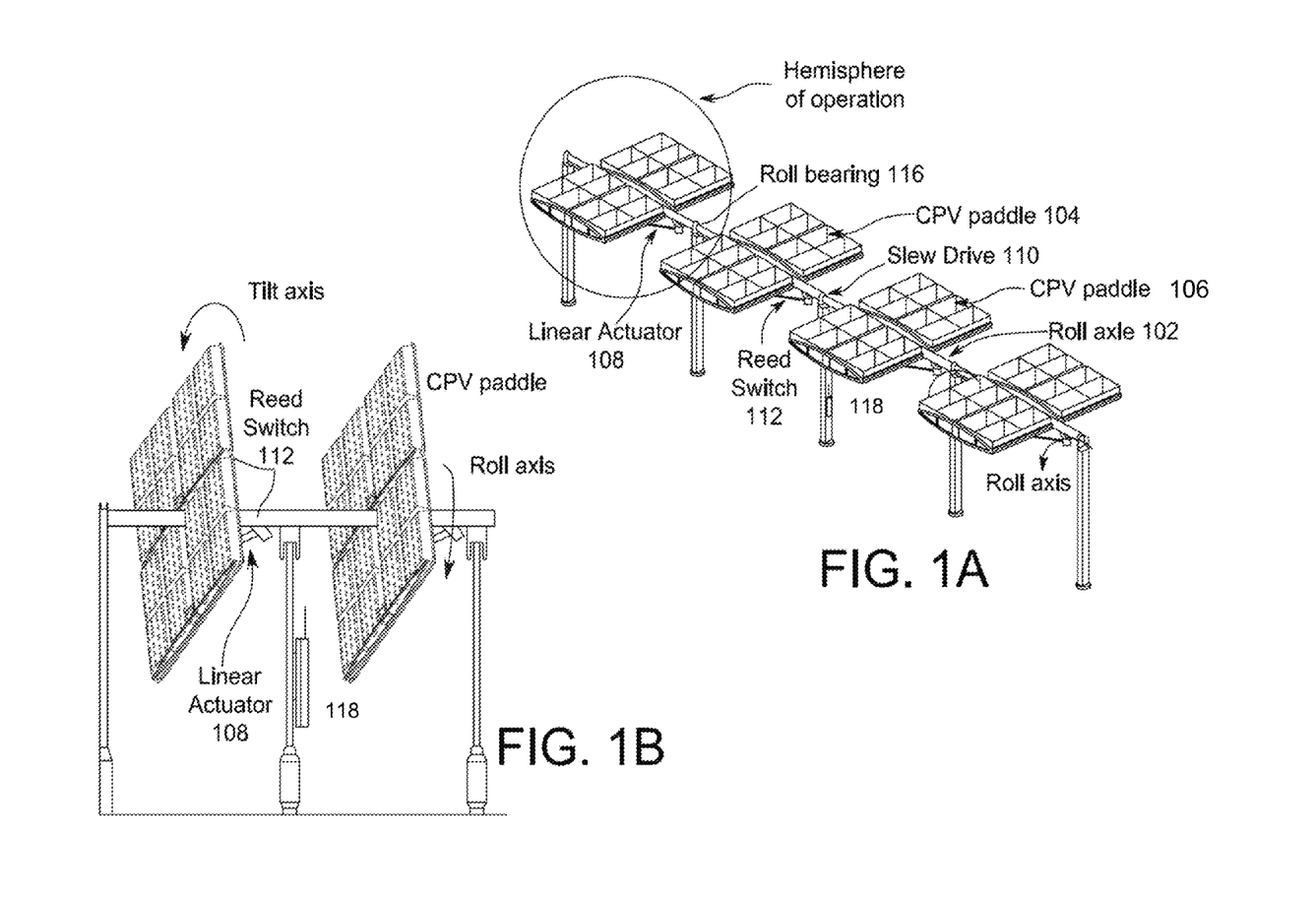
FIGS. 1A and 1B illustrate diagrams of an embodiment of a two axis tracking mechanism for a concentrated photovoltaic system having multiple independently movable sets of concentrated photovoltaic solar (CPV) cells.

FIGS. 1A and 1B illustrate diagrams of an embodiment of a two axis tracking mechanism for a concentrated photovoltaic system having multiple independently movable sets of concentrated photovoltaic solar (CPV) cells. FIG. 1A shows the paddle assemblies containing the CPV cells, such as four paddle assemblies, at a horizontal position with respect to the common roll axle. FIG. 1B shows the paddle assemblies containing the CPV cells tilted up vertically by the linear actuators with respect to the common roll axle.

A common roll axle 102 is located between 1) stanchions, and 2) multiple CPV paddle assemblies. Each of the multiple paddle assemblies, such as a first paddle assembly 104, contains its own set of the CPV solar cells contained within that CPV paddle assembly that is independently movable from other sets of CPV cells, such as those in the second paddle assembly 106, on that two axis tracking mechanism. Each paddle assembly is independently moveable on its own tilt axis and has its own drive mechanism for that tilt axle. The drive mechanism may be a linear actuator with a brushed DC motor. An example number of twenty-four CPV cells may exist per module, with one to eight modules per CPV paddle, two or more CPV paddle structures per paddle assembly, a paddle assembly per tilt axis, and two to four independently-controlled tilt axes per common roll axis.

Each paddle pair assembly has its own tilt axis linear actuator, such as a first linear actuator 108, for its drive mechanism to allow independent movement and optimization of that paddle pair with respect to other paddle pairs in the two-axis tracker mechanism. Each tilt-axle pivots perpendicular to the common roll axle 102. The common roll axle 102 includes two or more sections of roll beams that couple to the slew drive motor 110 and then the roll beams couple with a roll bearing assembly having pin holes for maintaining the roll axis alignment of the solar two-axis tracker mechanism at the other ends, to form a common roll axle 102. The slew drive motor 110 and roll bearing assemblies are supported directly on the stanchions. A motor control board in the integrated electronics housing 118 on the solar tracker causes the linear tilt actuators and slew drive motor 110 to combine to move each paddle assembly and its CPV cells within to any angle in that paddle assembly's hemisphere of operation. Each paddle assembly rotates on its own tilt axis and the paddle assemblies all rotate together in the roll axis on the common roll axle 102.

The tracker circuitry in the integrated electronics housing 118 uses primarily the Sun's angle in the sky relative to that solar array to move the angle of the paddles to the proper position to achieve maximum irradiance. A hybrid algorithm determines the known location of the Sun relative to that solar array via parameters including time of the day, geographical location, and time of the year supplied from a local GPS unit on the tracker, or other similar source. The two-axis tracker tracks the Sun based on the continuous latitude and longitude feed from the GPS and a continuous time and date feed. The hybrid algorithm will also make fine tune adjustments of the positioning of the modules in the paddles by periodically analyzing the power (I-V) curves coming out of the electrical power output circuits to maximize the power coming out that solar tracker.

The hybrid solar tracking algorithm resident in the integrated electronics housing 118 supplies guidance to the motor control board for the slew drive and tilt actuators to control the movement of the two-axis solar tracker mechanism. The hybrid solar tracking algorithm uses both 1) an Ephemeris calculation and 2) an offset value from a matrix to determine the angular coordinates for the CPV cells contained in the two-axis solar tracker mechanism to be moved to in order to achieve a highest power out of the CPV cells. The matrix can be populated with data from periodic calibration measurements of actual power being generated by a power output circuit of the two-axis solar tracker mechanism and applies Kalman filtering to those measurements over time of the operation of the solar tracking mechanism to create an offset value from the matrix applied to results of the Ephemeris calculation to determine the angular coordinates for the CPV cells. The motion control circuit is configured to move the CPV cells to the determined angular coordinates resulting from the offset value being applied to the results of the Ephemeris calculation.

Note, optimally tracking the Sun with four independently moveable paddle pair assemblies on a solar array is easier and more accurate across the four paddle pairs than with a single large array occupying approximately the same amount of area as the four arrays. In an example, four or more paddles, each contains a set of CPV cells, and form a part of the two-axis solar tracker mechanism. Each of these paddles may be part of a paddle pair assembly that rotates on its own tilt axis. For example, both a first paddle structure containing CPV cells on a first section of a first tilt axle and a second paddle structure containing CPV cells on a second section of the first tilt axle rotate on the axis of that first tilt axle. Likewise, both a third paddle structure containing CPV cells on a first section of a second tilt axle and a fourth paddle structure containing CPV cells on a second section of the second tilt axle rotate on the axis of that second tilt axle. In addition, both the first and second tilt axles connect perpendicular to the common roll axle that universally rotates all of the tilt axles.

The two-axis tracker includes a precision linear actuator for each of the paddle pairs in the four paddle pairs joined on the shared stanchions as well as the slew drive connect to the common roll axle 102. A set of magnetic reed sensors can be used to determine reference position for tilt linear actuators to control the tilt axis as well as the slew motor to control the roll axis on the common roll axle 102. Each tilt linear actuator may have its own magnetic reed switch sensor, such as a first magnetic reed sensor 112.

The paddle structure has only a few components that need to be assembled to install and secure in place in the field on the tracker assembly. The four tilt axle and roll beam assemblies are supported by five stanchions, and have the one integrated electronics system to control that tracker assembly. The stanchions support the tracker assembly and are shared between CPV paddle pairs. Each paddle pair has its own tilt axis linear actuator to allow independent movement and optimization of that paddle pair with respect to other paddle pairs in the tracker assembly. The tilt actuators and the slew drive motor control the position of the tilt and roll angles of the paddles to orient the CPV cells such that the maximum incoming light is focused to the photovoltaic collectors/receivers in the paddle pair.

Figure 2:
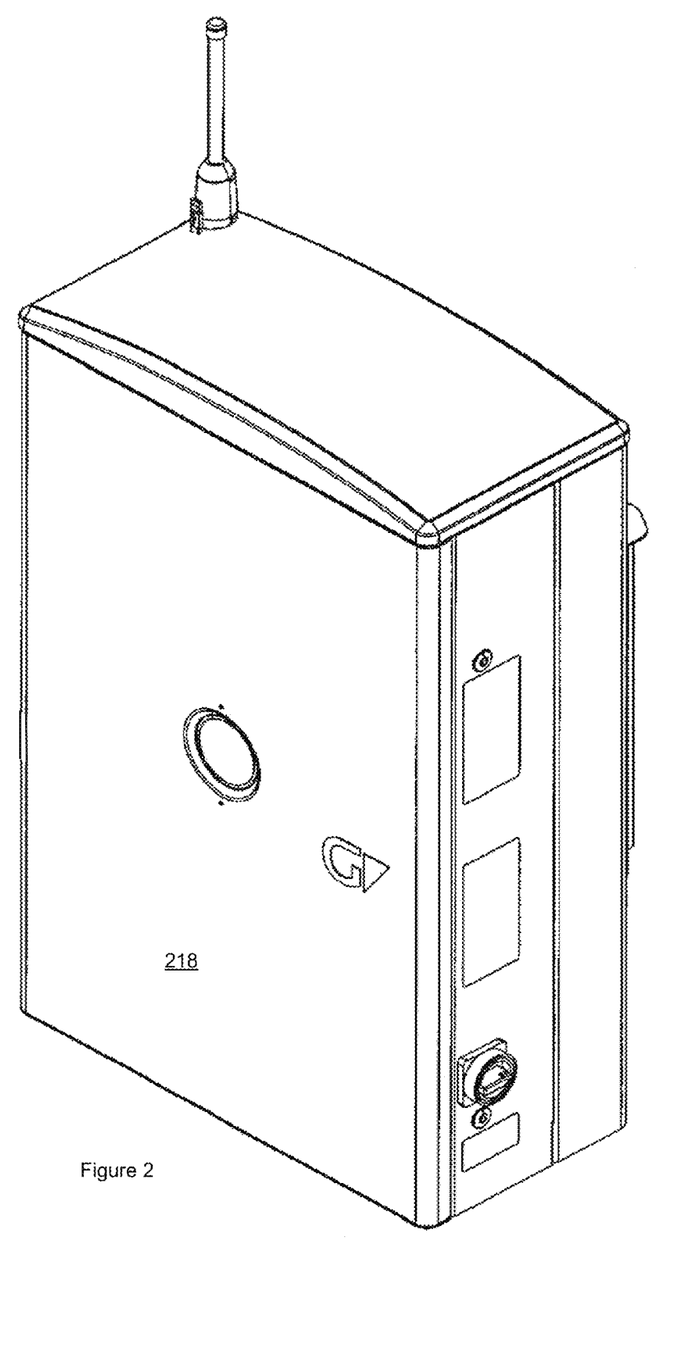
FIG. 2 illustrates a diagram of an embodiment of the integrated electronics housing that is at least partially weather-tight and acts as a local system control point for the two-axis tracker assembly.

FIG. 2 illustrates a diagram of an embodiment of the integrated electronics housing that is at least partially weather-tight and acts as a local system control point for the two-axis tracker assembly. The integrated electronics housing 218 may be mounted on the two-axis tracker assembly or nearby such as on a post.

Figure 3:
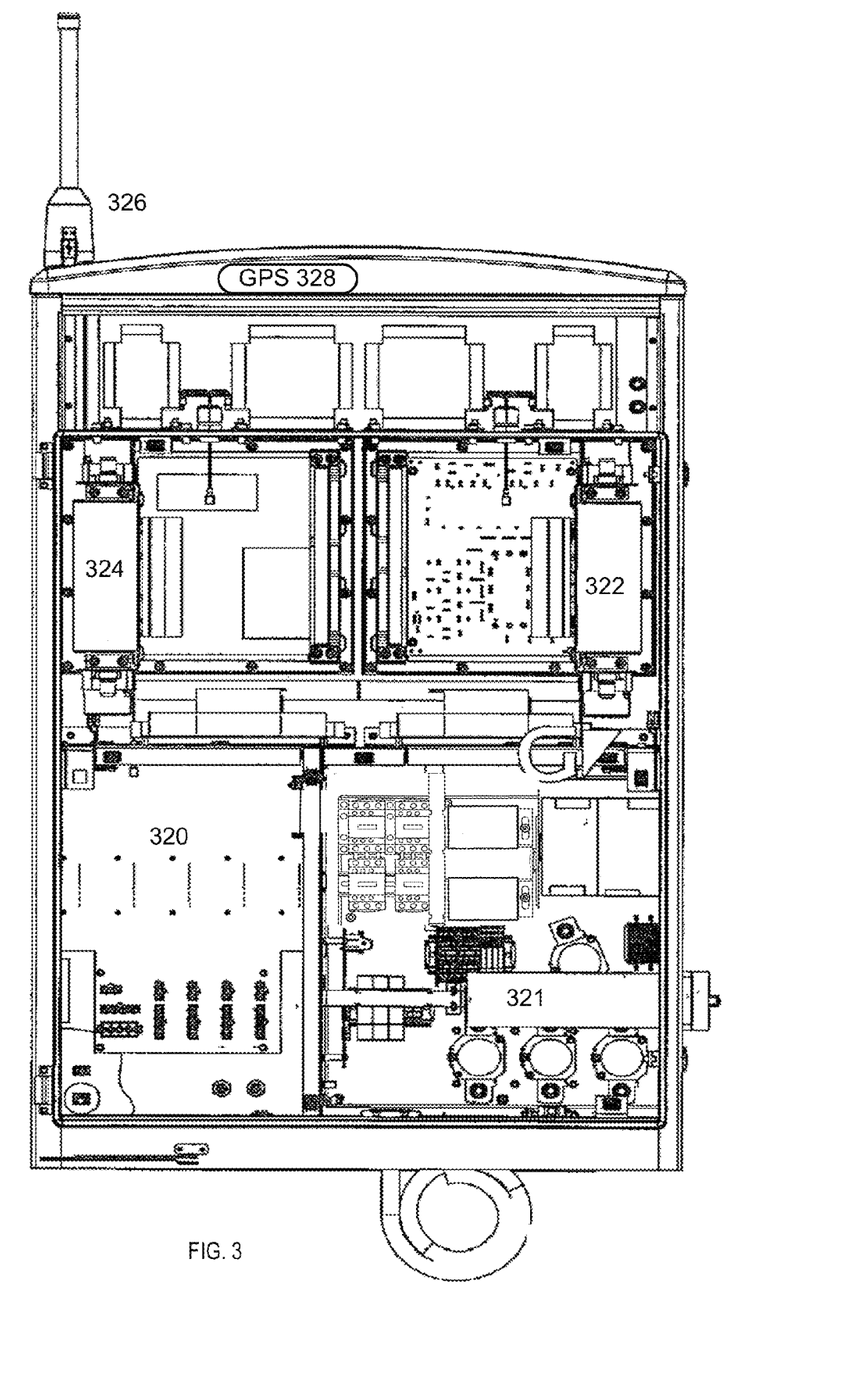
FIG. 3 illustrates a diagram of an embodiment of the integrated electronics housing with the front door and some isolation plates removed.

FIG. 3 illustrates a diagram of an embodiment of the integrated electronics housing with the front door and some isolation plates removed. The integrated electronics system is housed in an at least partially weather-tight housing unit. The integrated electronics housing 318 contains the motion control circuitry 320 that controls the movement of the two axis tracker, two or more inverter circuits 322, 324 that receive DC power from the CPV cells and converts the DC voltage to three phase AC power for the power grid, Wi-Fi circuitry 326, a main I/O board 321 with various circuits and software routines that collect and report performance, position, diagnostic, and weather data to the central backend management system. The housing 318 may also have a GPS unit 328 mounted in or on the housing, along with having the Wi-Fi antenna.

Figure 4:
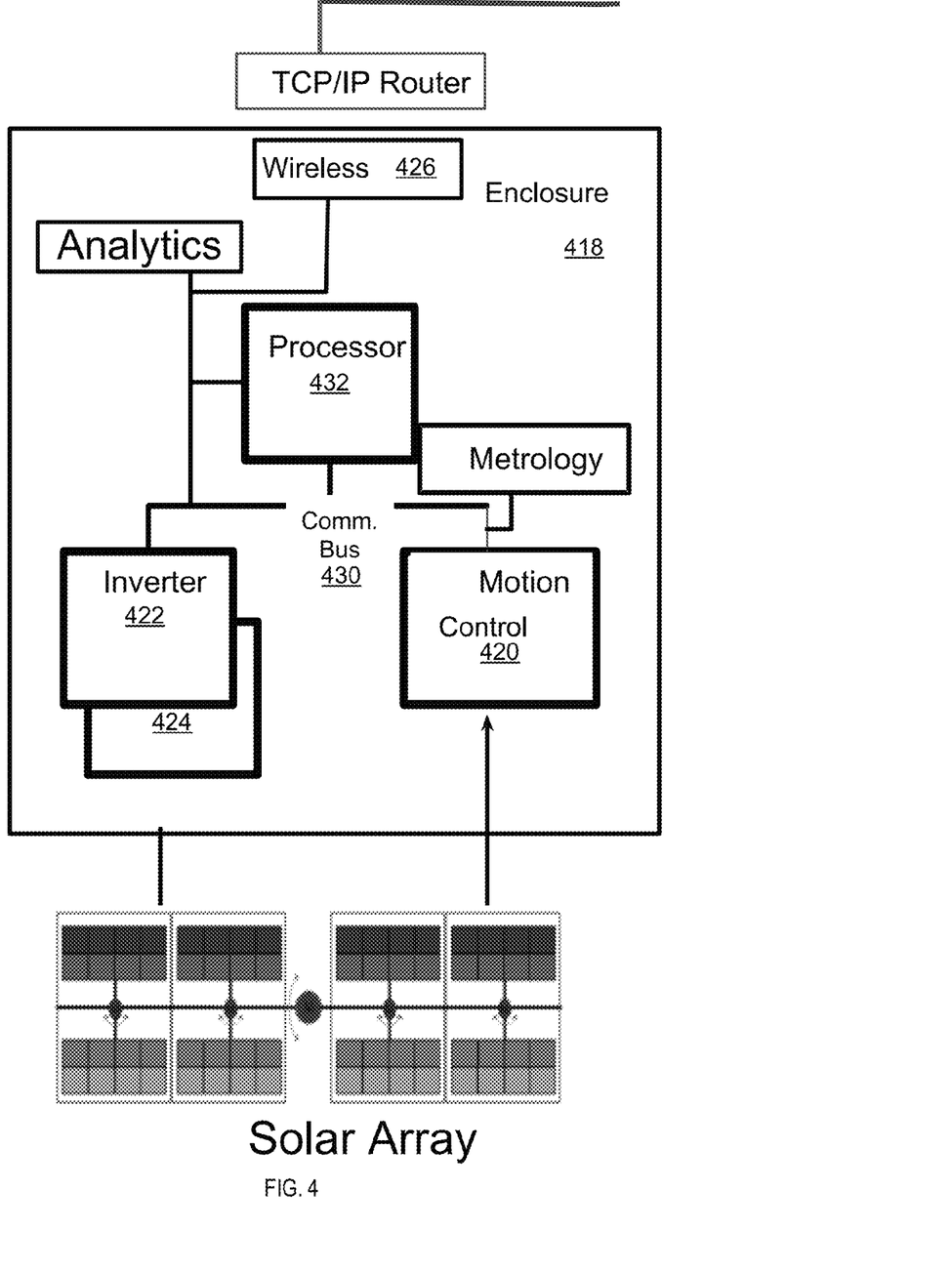
FIG. 4 illustrates a diagram of an embodiment of the integrated electronics housing containing both system electronics and power generation circuits for a two-axis tracker assembly having a concentrated photovoltaic solar array.

FIG. 4 illustrates a diagram of an embodiment of the integrated electronics housing containing both system electronics and power generation circuits for a two-axis tracker assembly having a concentrated photovoltaic solar array. The integrated electronics housing 418 contains circuits. One or more AC inverter circuits 422, 424 with switching devices generate three-phase Alternating Current (AC) voltage that is supplied to a utility power grid interface transformer. Each inverter 422, 424 receives a bipolar DC voltage supplied from its own set of CPV cells. One or more motion control circuits 420 move the CPV cells of the two-axis solar tracker mechanism to a determined angular coordinates resulting from an offset value being applied to a results of an Ephemeris calculation of a solar tracking algorithm. A backplane communication bus 430 connects to the motion control circuits 420 and the inverter circuits 422, 424 to facilitate communications of information including parameters of power being generated by the inverter circuits 422, 424 between the motion control circuits 420 moving the CPV cells and the AC inverter circuits 422, 424 to fine tune an AC power generated out of two axis tracker mechanism.

The wireless transmission/receiver circuit 426 transmits and receives communication from a router that is communicatively connected to the central backend management system over the Internet. The wireless transmission/receiver circuit 426 connects to circuits in the housing, such as the motion control circuits 420 and the inverter circuits 422, 424, via the communication bus 430, which allows faster communications and higher bandwidth internal communication from and between the discreet circuits contained within the integrated housing 418 than if those communications occurred via a wireless network or a network of external switchboards exchanging information over cables between the different circuits in their own housings. The wireless communication circuit 426 may send parameters gathered from other circuits in the housing to a central TCP/IP Router. The integrated electronics housing contains at least the wireless transmission/receiver circuit 426, the communication bus 430, the motion control circuits 420, a central processor shared by all the circuits 432, the inverter circuits 422, 424, and other circuits.

Metrology circuitry may be contained inside the housing or fed over the wireless local area network and includes instruments such as a thermometer, an anemometer, a barometer, a pyranometer, and other similar instruments. Integration of other sources of weather data can be achieved through a high speed interface. The metrology circuitry is configured when the anemometer detects high winds, then a command is generated to place the solar array to go into wind stow mode.

The integrated electronics housing also contains within or has located on the housing: a ground fault circuit for the set of CPV cells which signal a presence of a fault condition to the inverter circuit 422, 424, GPS, switch gear, a shared power supply circuit for the other circuits within the integrated housing, a central processor unit 432 connected to the communication bus 430 and provides shared processing power to at least the motion control circuits 420 and the inverter circuits 422, 424, and other useful circuits. The housing 418 and its circuits act as a local system control point for operating the two-axis tracker mechanism.

One or more local solar arrays, typically each solar array composed of multiple paddle pair assemblies, may have the integrated electronics housing 418 mounted on the support structure of that array and control all operations of that solar array. The concentrated photovoltaic (CPV) solar array consists of a large number of individual power units (focusing optics+solar cell) contained in paddle pair assemblies.

Figure 5:
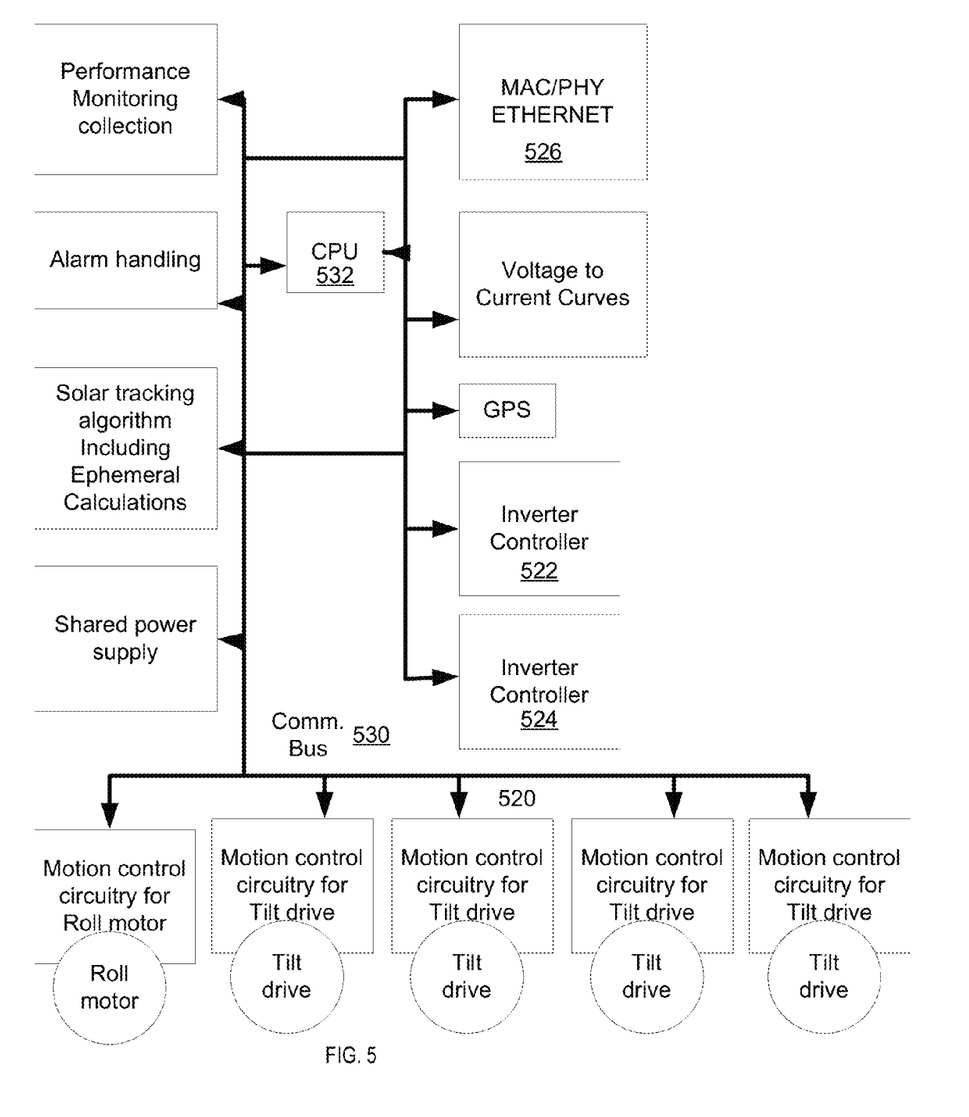
FIG. 5 illustrates a diagram of an embodiment of the integrated electronics housing containing both system electronics and power generation circuits.

FIG. 5 illustrates a diagram of an embodiment of the integrated electronics housing containing both system electronics and power generation circuits. As discussed, the motion control circuitry 520 that controls the movement of the CPV cells on the two-axis tracker assembly. The motion control circuitry 520 includes a single slew drive for roll rotation and multiple linear actuator drives for tilt rotation for all of the CPV cells on the two-axis tracker assembly. The motion control circuitry 520 controls the angles of the paddles with the CPV cells inside to track the Sun for maximum irradiance.

Each inverter circuit 522, 524 within the housing receives DC power from its own set of CPV cells, which are potentially located all on the same side of the tracker assembly and converts that DC power from the CPV cells to three phase 480 VAC power for the power grid.

The solar tracking algorithm may be a hybrid open and closed loop tracking algorithm configured to supply coordinates to the motion control circuit to adjust/fine tune the angle of the CPV cells to a maximum power output. A Global Position System unit 528 may be mounted in or on the housing and configured to continuously feed the time, date and latitude and longitude to the solar tracking algorithm resident within the integrated electronics housing for an Ephemeris calculation.

The electronic housing contains performance monitoring circuitry is integrated into some or all of the components including the motion control circuits 520 and the inverter circuits 522, 524. Software coding and logic circuitry are built-in for CPV string level performance monitoring on each array to allow 1) real-time performance feedback, 2) remote monitoring of the two axis tracker assembly, and 3) local measurements and generation of a current-voltage (IV) curve, 4) a built in controller using a hybrid of open and closed loop algorithm to provide feedback to the tracker control circuit to adjust/fine tune the angle of each paddle to a maximum power output; 5) a voltage clamp circuit to limit the DC input voltage to less than 1200 VDC; and 6) many other features.

The central processor circuitry 532 is configured to perform the Ephemeris calculation for use by the motion control circuits 520 to position the CPV cells relative to a current angle of the Sun. The Ephemeris calculation provides the data to position the CPV panels relative to the current angle of the Sun. The central processor circuitry 532 also performs computing and generation of Alarms in near real time, calculating performance modeling, and other general processing include network communications to transmit to the central backend management system over the Internet.

The solar tracking algorithm uses both 1) the Ephemeris calculation, with local GPS position data of the solar tracker mechanism from a global positioning circuit that is part of the integrated electronics housing to determine angular coordinates that CPV cells contained in the two axis tracker assembly should be ideally positioned to relative to a current position of the Sun and 2) applies Kalman filtering that is continuously updated with power measurements over the time of an operation the two axis tracker assembly to create the offset matrix. The measured actual power output comes from the (I-V) curves taken off the inverter circuits 522, 524. Power optimization may occur in the solar array through integration of inverter and tracker motion control circuits and feedback between each other to fine tune the power optimization.

The housing may also contain additional intelligent power and control circuits that can respond to events on site and that also cooperate with the central backend management system for control of the local devices over the Internet.

Figure 6:
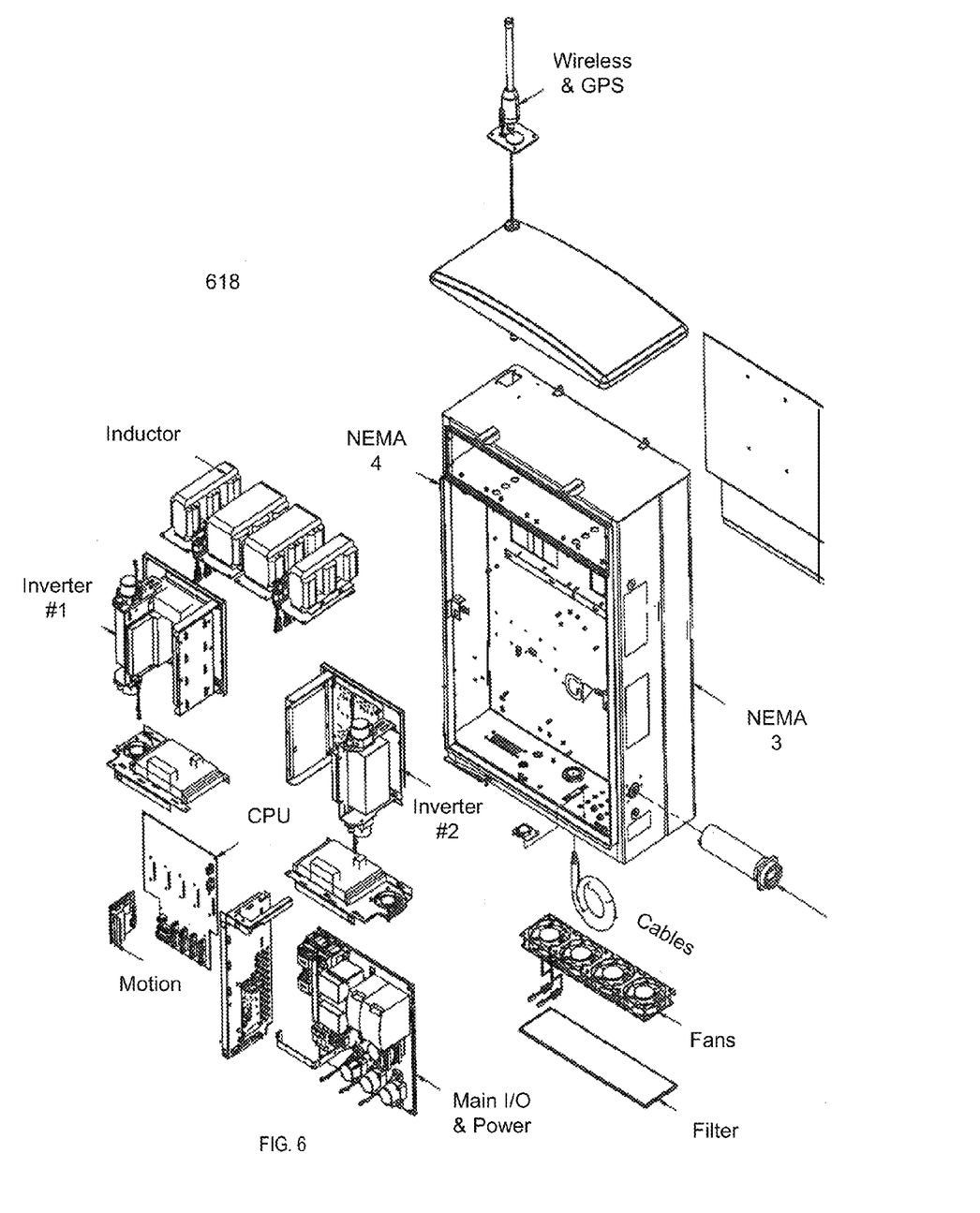
FIG. 6 illustrates an exploded view of an embodiment of the integrated electronics housing containing both system electronics and power generation circuits.

FIG. 6 illustrates an exploded view of an embodiment of the integrated electronics housing containing both system electronics and power generation circuits. The integrated electronics housing 618 has two or more chambers including a NEMA-4 and Nema-3 enclosure. The Integrated NEMA-4 housing enclosure contains the integrated power electronics for CPV-Inverter, the solar tracker algorithm and associated motion control circuits for the angles of the paddle assemblies on the two axis tracker, the wireless communication circuit to the remote control system; the CPU, and other local electronics for each solar array.

The housing has two or more chambers including a NEMA-4 chamber that seals the electronic circuitry inside the chamber from an environment exterior to the housing, and a NEMA-3 chamber where the components and electronic circuitry contained within are exposed to the outside environment to facilitate cooling and heat dissipation requirements and/or other special requirements.

In an embodiment, the motor control circuitry is installed into the NEMA 4 chamber of the housing. A multiplicity of a three phase AC inverter circuits are also installed into the NEMA 4 chamber of the housing. In addition, the NEMA 4 chamber of the housing contains the backplane communication bus coupled to each of the circuits in the NEMA 4 chamber, the local code employed for the solar tracking algorithm, a central processor coupled the backplane communication bus and supplies processing power to any of the circuits coupled to the backplane communication bus.

The NEMA 4 housing enclosure is sealed to prevent environmental contamination into the electronics inside. The integrated housing enclosure also includes a switch gear such as a AC disconnect, DC disconnect, etc., a built in antenna for the Wi-Fi circuitry located inside the housing, and GPS to allow accurate positioning to identify the position of this solar array within the grid of solar arrays located as a generation facility, and circuitry to obtain real time 3rd party weather forecasts through a high speed interface. Thus, the NEMA 4 chamber contains a high speed interface to integrate local weather station data through the high speed interface, which the weather data is then communicated to a central backend management system over an Internet.

Each inverter circuit is built modularly with electrical connections to slide into place within the integrated housing and slide out from the integrated housing as an entire unit, which allows easier serviceability in the field, as well as easier assembly of the integrated electronics housing at the manufacturing facility. Also, a known tested good inverter circuit can be slid into the integrated housing both at the manufacturing facility and in the field to decrease the time and cost with building and operating this integrated housing.

Figure 7:
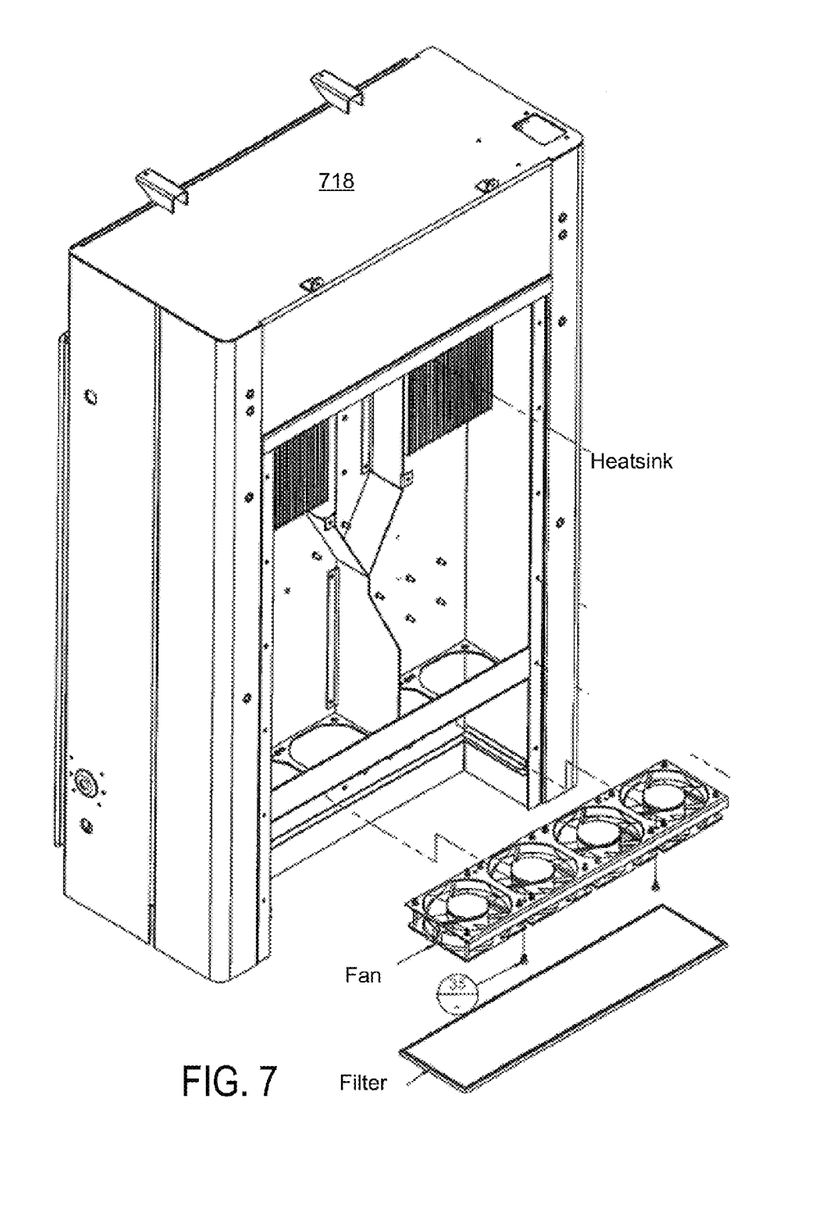
FIG. 7 illustrates a diagram of an embodiment of the NEMA 3 chamber of the integrated electronics housing.

FIG. 7 illustrates a diagram of an embodiment of the NEMA 3 chamber of the integrated electronics housing. The NEMA 3 housing enclosure contains the electrical components needing cooling and heat dissipation via mechanisms such as a fan, high temperature inductors, exposed heat sinks, etc. The NEMA 3 chamber of the housing 718 contains a set of fans fed by a filter that bring cooling from exterior to the housing, a set of heat sinks attached to the electronics circuits in the NEMA 4 chamber, and high heat generating components including a set of inductors for the inverter circuits.

Figure 8:
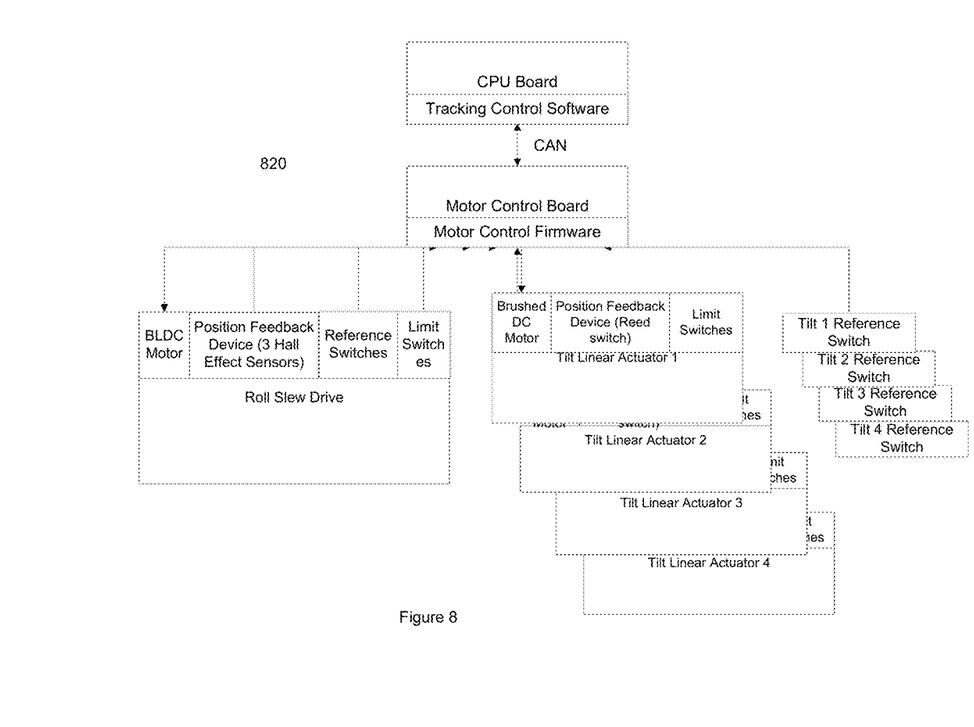
FIG. 8 illustrates a diagram of an embodiment of the tracker motion control circuits for the multiple tilt drives for the linear actuators and the one slew drive roll motor for a combination of continuous and discrete motion to achieve high-accuracy.

FIG. 8 illustrates a diagram of an embodiment of the tracker motion control circuits for the multiple tilt drives for the linear actuators and the one slew drive roll motor for a combination of continuous and discrete motion to achieve high-accuracy. The motion control circuit 820 controls 1) a drive mechanism for each tilt axle, and two or more tilt axles are part of the two axis tracker assembly, and 2) a common roll axle slew drive that moves all of the sets of CPV cells on the two-axis tracker assembly in the roll axis. The motion control circuit also contains programming and a memory to determine an offset value to be applied to the results of an Ephemeris calculation in the solar tracking algorithm based on Kalman filtering.

The motor control circuitry receives a calculated target position that the CPV cells should be moved to from the solar tracking algorithm as well as a current position of the CPV cells from reed switches mounted on the two axis tracker assembly and a tracked amount of revolutions of the actuator drives and drive motors. The motor control board then moves the paddle assemblies containing the CPV cells to the targeted position. The tracker motion control circuits may contain discrete circuits for an example four tilt motors for the linear actuators and one slew drive roll motor, which in combination provide continuous and discrete motion to achieve high-accuracy.

Figure 9:
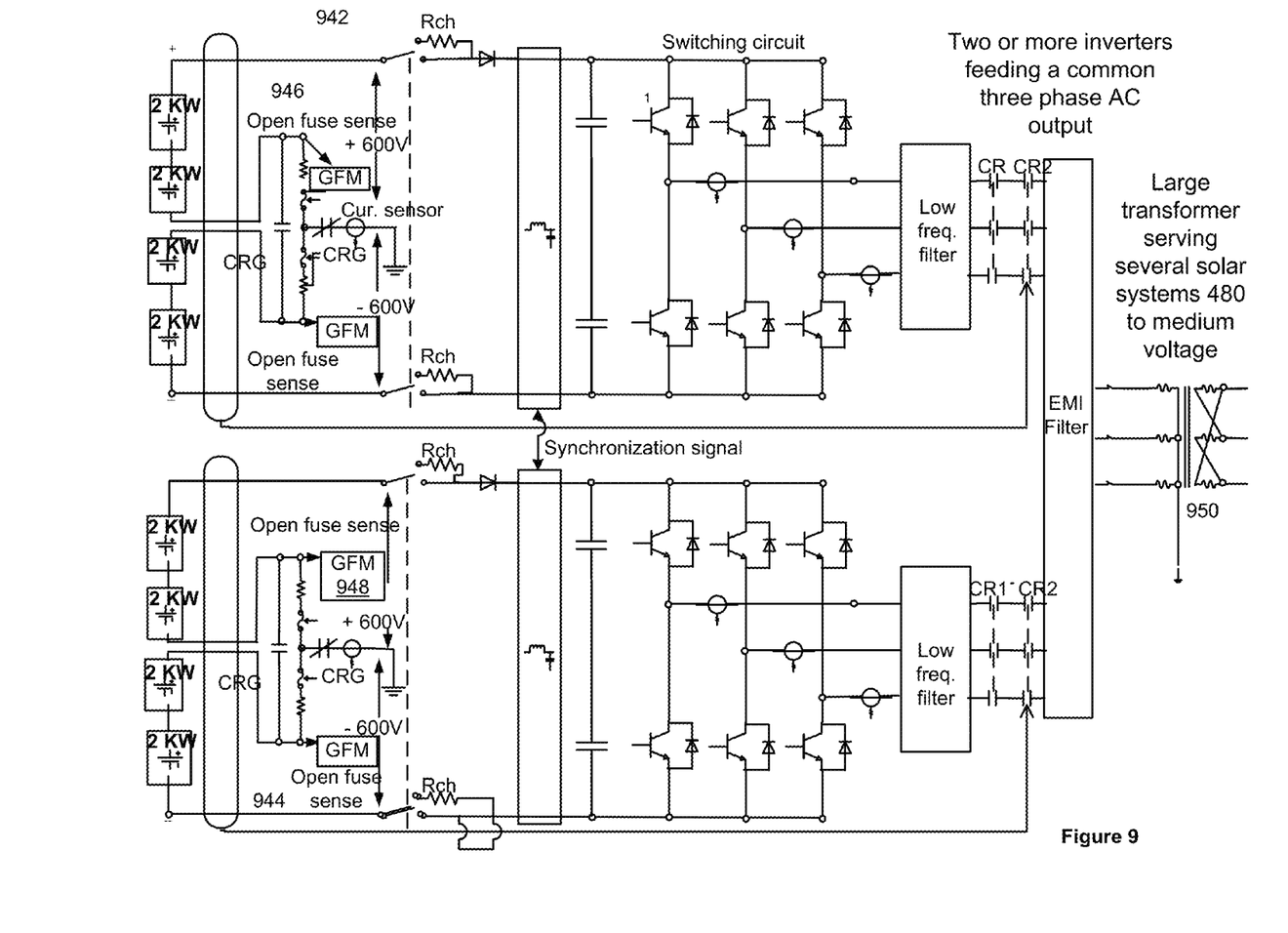
FIG. 9 illustrates a diagram of an embodiment of at least two or more AC inverter circuits that are contained with the integrated electronics housing.

FIG. 9 illustrates a diagram of an embodiment of at least two or more AC inverter circuits that are contained with the integrated electronics housing. An example first three-phase AC inverter circuit 942 of the two or more inverter circuits and a second three-phase AC power generation unit 944 of the two or more inverter circuits are contained with the integrated electronics housing. A first string of CPV cells all from the East side of the solar array feeds the first inverter circuit 942. A second string of CPV cells all from the West side of the solar array feeds the second inverter circuit 944. This grouping of similarly shaded modules into the same string of CPV cells feeding a particular inverter circuit 942, 944 tends to allow a more narrow input working voltage into that three-phase AC inverter circuit, which avoids a DC-to-DC boost stage requirement between the input DC voltage circuit portion and the AC conversion portion in that three-phase AC inverter circuit.

Thus, each AC inverter circuit 942, 944 has a single stage DC-to-AC voltage conversion circuit. Each inverter receives a bipolar DC voltage supplied from its own set of CPV cells. The three-phase AC inverter circuit has no need for a supplemental input DC voltage level boosting strategy, including a DC input boost stage to increase the DC input voltage level to a higher DC voltage level for the DC to AC conversion, because the supplied bipolar DC input voltage level from the set of CPV cells is high enough to directly convert to the AC working voltage level.

Each inverter circuit 942, 944 may have multiple strings of CPV cells feeding that inverter circuit. The strings connect to the inverter circuit which allows the multiple strings of CPV cells to each supply less than a nominal 600 VDC and use less costly conduit and cables to carry the maximum 600 VDC input voltage from that string to the housing enclosure. Merely, the housing enclosure of the integrated electronic housing is required to accommodate voltages of up to 1200 VDC.

The ground fault circuitry 946, 948 in each inverter circuit 942, 944 is configured to detect a ground fault with any the CPV cells from the solar array feeding that inverter circuit. The ground fault circuitry 946, 948 is contained within the housing and connects to the communication bus to send notice of a fault to both 1) the inverter circuit to activate its isolation contacts and 2) to the wireless circuit for reporting to the central backend management server.

The multiplicity of the three phase AC inverter circuits electrically connect into a common three phase AC output to feed a single Utility Power Grid transformer 950. Each inverter circuit 942, 944 has 1) its own set of isolation contacts to connect as well as isolate this particular inverter from the Utility Power Grid interface transformer 950. A primary-side common node of the Utility Power grid interface transformer 950 may be connected to Earth ground.

As discussed, at least the motion control, inverter circuits, and the ground fault circuitry contain distributed performance monitoring circuitry, which provides remote reporting of measurements and potentially notification of alarms in near real time to the central management server system.

Figure 10:
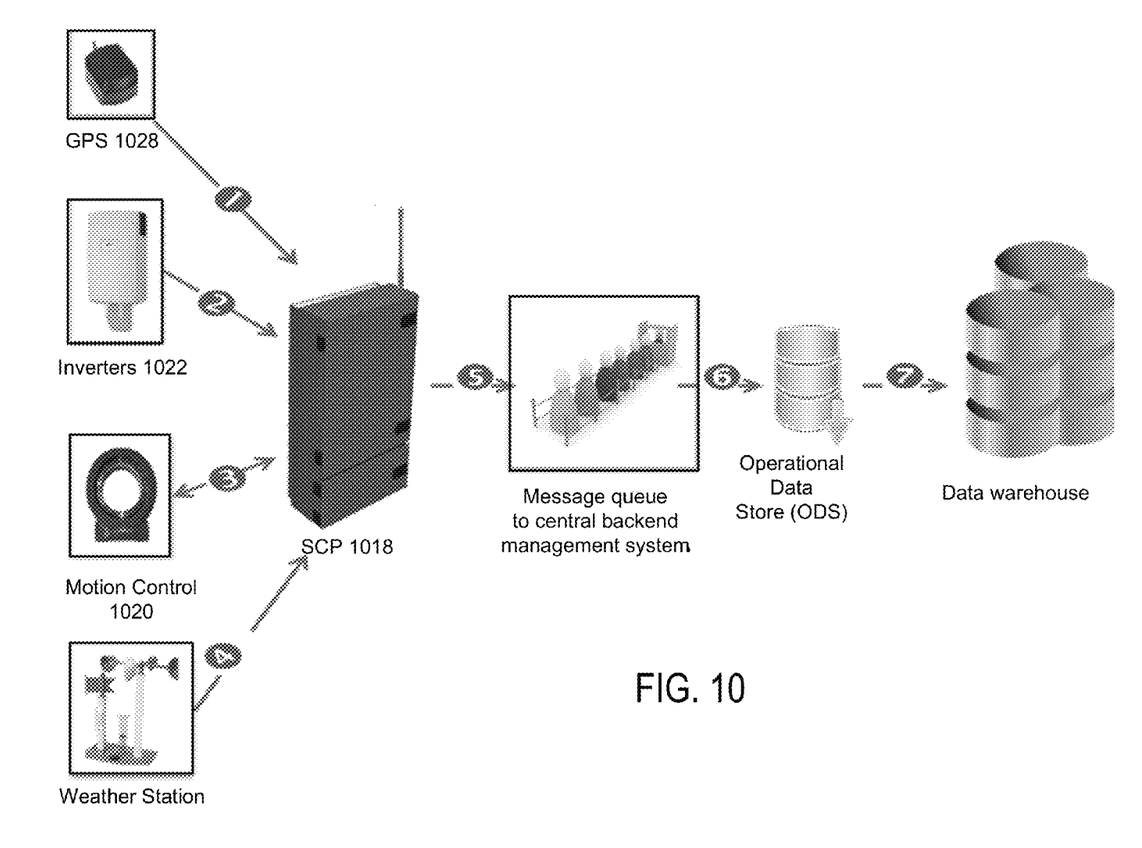
FIG. 10 illustrates a diagram of an embodiment of the wireless transmission/receiver circuit to transmit and receive communication from a router that is communicatively connected to a central backend management system over an Internet.

FIG. 10 illustrates a diagram of an embodiment of the wireless transmission/receiver circuit to transmit and receive communication from a router that is communicatively connected to a central backend management system over an Internet. The global positioning system (GPS) circuitry is configured to provide geographical position information of the CPV solar array of the two axis tracker mechanism at the solar site. The GPS on the two axis tracker mechanism eliminates any estimating of a particular tracker's location relative to the Sun in the sky or estimating where a particular tracker is positionally located in the row and columns of two axis tracker mechanism in the solar generation site, which allows a more accurate pointing of the solar array, with respect to the Sun. The central backend management system may include a set of servers, a message queue in the server, an operational data store, a data warehouse, and other components.

The wireless circuitry is configured to transmit performance monitoring information to the central backend management system using a secure communication channel protocol. The wireless communication between the central backend management system allows substantial reduction in cabling and conduit laid throughout the site where the two-axis tracker assembly is located.

As discussed, at least the motion control circuits, the inverter circuits and the GPS circuitry associated with the housing are configured to communicate information about the CPV solar array and the two-axis tracker mechanism to a central backend management system over an Internet via a wireless router for the LAN located at the solar site. Integrated performance monitoring is designed into the circuitry and resident applications in the integrated electronics housing for this concentrated photovoltaic system and the information is communicated over the Internet to the central backend management system. The performance monitoring information collected and stored in a memory in the housing includes two or more of information for 1) a string of CPV cells supplying DC power in the solar array, 2) AC power, AC/DC current, AC/DC Voltages, and current to voltage (IV) curves associated with the inverter circuits, 3) configuration information of the string in the solar array, 4) ground fault conditions on the CPV cells, 5) a direct normal irradiation (DNI) information for the solar array, 6) streaming video captured by a camera associated with the solar array, 7) weather information including air temperature, wind speed, precipitation, and other local weather information where the solar array is located, 8) tracking information of the angular coordinates of the solar array, and 9) geographic position information of the solar at the solar site as generated by GPS circuitry, and then real time alarms and events are generated based on these collected parameters.

The on-board, real time, high resolution performance monitoring test points built into each of the components in the solar site allow remote control, monitoring, and alert notification features over the Internet of those components. Thus, the electronic circuits, for example, in the motors, photovoltaic cells, tilt axis, etc., have test points built in to monitor parameters, and then relay these parameters, via the Wi-Fi and other network communications, back to the ISIS backend system. The integrated electronics housing for a local system control point on each CPV solar array may contain and/or house all of the electronic circuitry for the inverters, tracking circuitry, power supplies, GPS circuits, Wi-Fi circuits, etc and sends this information over the Internet for storage in the ISIS operational data store and data warehouse. The current data of the individual components at the site along with all of the historical data of those components is maintained in these databases. The same database maintains the data for all of the sites allowing for better trend analysis. For example, I-V curves for each panel can be analyzed over time to see changes. Real time alarms and events are also generated based on the parameters contained in the incoming data flow.

Various routines are scripted in code for monitoring components, triggering events, and alerting for the presence of 1) faulty components throughout the system; 2) string performance and failure conditions; 3) tracker position and motor function; 4) inverter performance and 5) other component alerts and failure conditions. Some are based on comparisons to threshold based on actual manufactured data.

Thus, enough parameters for each of the components are conveyed to obtain a complete picture of what is happening on each solar array at the site at each level of granularity. The system level tie-in between the hardware architecture and the software coded to operate and monitor the architecture provides enough parameters for each of the components to obtain the complete current picture as well as any historical data need for the complete picture with trend analysis.

Overall, the integrated electronic housing contains multiple circuits that cohesively exist in a single and actually perform better because of the interconnectivity. Each inverter circuit in the integrated electronic housing has a maximum power point tracking circuit (MPPT) configured to proactively seek the optimum performance point for the paddle pair assemblies of the solar array associated with that MPPT. Stable, secure operation utilizing closed-loop feedback is provided by an on-board system control CPU. The integrated electronics housing for each 16-kW CPV array can be equipped with two or more, high-efficiency, industrial-grade inverter circuits in NEMA-4 enclosure. This provides a distributed configuration that simplifies installation and maximizes overall power plant uptime. The dual, ±600 V, bi-polar inverters convert the DC power from the module strings directly to 480 V, 3-phase, AC power without the use of transformers. The one or more DC-to-AC inverter circuits is included in the integrated electronics housing for that array, eliminate combiner boxes, fuses, and in-ground DC wiring, thereby further reducing costs during installation. This integrated electronic housing design reduces complexity and cost while also reducing wiring and other installation labor. The solar array is mounted on the high-precision, two-axis, solar tracker assembly and the integrated electronic housing may be mounted on the two-axis tracker assembly. Individual motion control is provided for each paddle pair in the solar array by the motion control circuits. The motion control circuits provide precision tracking to increase yield. Most photovoltaic systems are mounted in a fixed position. They operate at maximum production only during a brief period of the day when the Sun's rays fall directly normal to the module surface. The motion control circuits move the solar array to accurately track the Sun through the day and year so that the solar modules operate at peak efficiency, resulting in a dramatically greater energy harvest than a fixed-tilt system. The integrated electronic housing contains Wi-Fi and GPS for communication to the central backend server management system for monitoring and management via a secure Virtual Private Network. The GPS and Wi-Fi also enable automatic solar array commissioning.

Assimilating third party weather data for remote control of system operation, and integration of the weather station data through a high speed interface to assist in remote control of each CPV solar array.

Multiple solar sites cooperate with the backend management center and may provide local site weather parameters to supplement the weather information from the publicly available weather data. The local site weather parameters and third party weather data may be integrated through a high speed interface to enable accurate remote control of the system operation. The ISIS also has real time weather data including forecasting. ISIS will continuously collect Weather & Solar information from the weather masters. If a weather master detects high winds, the local code inside the housing generates a command for the solar arrays within the weather master range (defined by the user) to go into wind stow mode.

Although the foregoing embodiments have been described in some detail for purposes of clarity of understanding, the invention is not limited to the details provided. The Solar array may be organized into one or more paddle pairs. Functionality of circuit blocks may be implemented in hardware logic, active components including capacitors and inductors, resistors, and other similar electrical components. There are many alternative ways of implementing the invention. The disclosed embodiments are illustrative and not restrictive.

We claim:

1. An integrated electronics housing containing both system electronics and power generation circuits for a two-axis tracker assembly having a Concentrated PhotoVoltaic (CPV) solar array; comprising:
    one or more Alternating Current (AC) inverter circuits with switching devices that generate three-phase AC voltage supplied to a utility power grid interface transformer, where each inverter receives a bipolar DC voltage supplied from its own set of CPV cells;
    one or more motion control circuits configured to move the CPV cells of the two-axis solar tracker mechanism to angular coordinates resulting from a solar tracking algorithm; and
    a backplane communication bus connecting to the motion control circuits and the inverter circuits to facilitate communications of information including parameters of power being generated by the inverter circuits between the motion control circuits and the AC inverter circuits to fine tune an AC power generated out of the two axis tracker mechanism, and where the integrated electronics housing contains at least the communication bus, the motion control circuits, and the inverter circuits, and acts as the local system control point for the two-axis solar tracker mechanism.

2. The integrated electronics housing of claim 1, further comprising:
    a wireless transmission/receiver circuit to transmit and receive communication from a router that is communicatively connected to a central backend management system over an Internet, where the wireless transmission/receiver circuit is contained within the integrated housing and connects to the motion control circuits, and the inverter circuits via the communication bus, which allows faster communications and higher bandwidth internal communication from and between the discreet circuits contained within the integrated housing than if those communications occurred via a wireless network or a network of external switchboards exchanging information over cables between the different circuits in their own housings.

3. The integrated electronics housing of claim 1, further comprising:
    a global positioning system (GPS) circuitry configured to provide geographical position information of the CPV solar array of the two axis tracker mechanism, wherein the housing also includes the GPS circuitry and wireless communication circuitry, wherein at least the motion control, the inverter power generation and the GPS circuits associated with the housing are configured to communicate information about the CPV solar array and the two-axis tracker mechanism to a central backend management system over an Internet via a wireless router for the local area network located at the solar site, where the GPS on the two axis tracker mechanism eliminates any estimating of a particular tracker's location relative to the Sun in the sky or estimating where a particular tracker is positionally located in the row and columns of two axis tracker mechanism in the solar generation site, which allows a more accurate pointing of the solar array, with respect to the Sun.

4. The integrated electronics housing of claim 1, where each inverter circuit has multiple strings of CPV cells feeding that inverter circuit, and the strings connect to the inverter circuit, which allows the multiple strings of CPV cells to each supply less than a nominal 600 VDC and use less costly conduit and cables to carry the maximum 600 VDC input voltage from that string to the housing enclosure, and merely the housing enclosure of the integrated electronic housing is required to accommodate voltages of up to 1200 VDC.

5. The integrated electronics housing of claim 1, where the integrated electronics housing also includes a ground fault circuit for the set of CPV cells which signal a presence of a fault condition to the inverter circuit, a wireless communication circuit to send parameters gathered from other circuits in the housing to a central TCP/IP Router, a shared power supply circuit for the other circuits within the integrated housing, a central processor unit connected to the communication bus and provides shared processing power to at least the motion control circuits and the inverter circuits, where all of these circuits are contained within or located on the housing in this local system control point for operating the two axis tracker mechanism.

6. The integrated electronics housing of claim 1, further comprising:
- where the motion control circuitry that controls the movement of the CPV cells on the two-axis tracker assembly, the motion control circuitry includes a single slew drive for roll rotation and multiple linear actuators for tilt rotation for all of the CPV cells on the two-axis tracker assembly;
- where each inverter circuit within the housing receives DC power from its own set of CPV cells, which are located all on the same side of the two-axis tracker assembly and converts that DC power from the CPV cells to three phase 480 VAC power;
- a Global Position System unit mounted in or on the housing that continuously feeds the time, date and latitude and longitude to the solar tracking algorithm resident within the integrated electronics housing for an Ephemeris calculation;
- software coding and logic circuitry are built-in for CPV string level performance monitoring on each array to allow 1) real-time performance feedback, 2) remote monitoring of the two axis tracker assembly, and 3) local measurements and generation of a current-voltage (IV) curve;
- where the solar tracking algorithm is a hybrid open and closed loop tracking algorithm configured to supply coordinates to the motion control circuit to adjust/fine tune the angle of the CPV cells to a maximum power output;
- a central processor circuitry configured to perform the Ephemeris calculation for use by the motion control circuits to position the CPV cells relative to a current angle of the Sun; and
- logic to compute and generate alarms in near real time, calculating performance modeling, and other general processing include network communications to transmit to the central backend management system over the Internet.

7. The integrated electronics housing of claim 1, further comprising:
- where the housing has two or more chambers including a NEMA-4 chamber that seals the electronic circuitry inside the chamber from an environment exterior to the housing, and a NEMA-3 chamber where the components and electronic circuitry contained within are exposed to the outside environment to facilitate cooling and heat dissipation requirements.

8. The integrated electronics housing of claim 1, where at least two or more AC inverter circuits are contained with the integrated electronics housing, and where a primary-side common node of the Utility Power grid interface transformer is connected to Earth ground, where each inverter circuit has its own set of isolation contacts to connect as well as isolate this particular inverter from the Utility Power Grid interface transformer, and where each inverter circuit is built modularly with electrical connections to slide into place within the integrated housing and slide out from the integrated housing as an entire unit, which allows easier serviceability in the field, as well as easier assembly of the integrated electronics housing at the manufacturing facility.

9. The integrated electronics housing of claim 1, further comprising:
- ground fault circuitry in each inverter circuit configured to detect a ground fault with any the CPV cells from the solar array feeding that inverter circuit, where the ground fault circuitry is contained within the housing and connects to the communication bus to send notice of a fault to both 1) the inverter circuit to activate its isolation contacts and 2) to a wireless circuit for reporting to the central management server, and
- where at least the motion control circuits, inverter circuits, and ground fault circuitry contain distributed performance monitoring circuitry, which provides remote reporting of measurements and notification of alarms in near real time to the central management server.

10. The integrated electronics housing of claim 1, further comprising:
- at least two or more AC inverter circuits contained with the integrated electronics housing;
- a first three-phase AC inverter circuit of the two or more inverter circuits;
- a second three-phase AC power generation unit of the two or more inverter circuits, where a first string of CPV cells all from the East side of the solar array feeds the first inverter circuit, and a second string of CPV cells all from the West side of the solar array feeds the second inverter circuit, and this grouping of similarly shaded modules into the same string of CPV cells feeding a particular inverter circuit tends to allow a more narrow input working voltage into that three-phase AC inverter circuit, which avoids a DC-to-DC boost stage requirement between the input DC voltage circuit portion and the AC conversion portion in that three-phase AC inverter circuit, and
- where the integrated electronics housing is mounted on the two-axis tracker assembly.

11. The integrated electronics housing of claim 1, where the motion control circuit controls 1) a drive mechanism for each tilt axle and two or more tilt axles are part of the two axis tracker assembly, and 2) a common roll axle slew drive that moves all of the sets of CPV cells on the two-axis tracker assembly in the roll axis, where the motion control circuit also contains programming and a memory to determine an offset value to be applied to the results of an Ephemeris calculation in the solar tracking algorithm based on Kalman filtering.

12. The integrated electronics housing of claim 1, further comprising:
- wireless circuitry configured to transmit performance monitoring information to a central backend management system using a secure communication channel protocol, wherein the wireless communication between the central backend management system allows substantial reduction in cabling and conduit laid throughout the site where the two axis tracker assembly is located, wherein the performance monitoring information collected and stored in a memory in the housing includes two or more of information for 1) a string of CPV cells supplying DC power in the solar array, 2) AC power, AC/DC current, AC/DC Voltages, and current to voltage (IV) curves associated with the inverter circuits, 3) configuration information of the string in the solar array, 4) ground fault conditions on the CPV cells, 5) a direct normal irradiation (DNI) information for the solar array, 6) streaming video captured by a camera associated with the solar array, 7) weather information including air temperature, wind speed, precipitation, and other local weather information where the solar array is located, 8) tracking information of the angular coordinates of the solar array, and 9) geographic position information of the solar at the solar site as generated by GPS circuitry, and where then real time alarms and events are generated based on these collected parameters.

13. The integrated electronics housing of claim 11, where a multiplicity of a three phase AC inverter circuits are installed into a NEMA 4 chamber of the housing, and each AC inverter circuit has a single stage DC-to-AC voltage conversion circuit, and the multiplicity of the three phase AC inverter circuits electrically connect into a common three phase AC output to feed a single Utility Grid transformer, where each inverter circuit receives a bipolar DC voltage supplied from its own set of CPV cells, where the three-phase AC inverter circuit has no need for supplemental input DC voltage level boosting strategies, including a DC input boost stage to increase the DC input voltage level to a higher DC voltage level for the DC to AC conversion, because the supplied bipolar DC input voltage level from the set of CPV cells is high enough to directly convert to the AC working voltage level.

14. The integrated electronics housing of claim 1, where the motor control circuitry is installed into a NEMA 4 chamber of the housing, and where the motor control circuitry receives a calculated target position that the CPV cells should be moved to from the solar tracking algorithm as well as a current position of the CPV cells from reed switches mounted on the two axis tracker assembly and a tracked amount of revolutions of the actuator drives and drive motors.

15. The integrated electronics housing of claim 1, where a NEMA 4 chamber of the housing contains the one or more inverter circuits, the motion control circuits, the backplane communication bus coupled to each of the circuits in the NEMA 4 chamber, the local code employed for the solar tracking algorithm, a central processor coupled the backplane communication bus and supplies processing power to any of the circuits coupled to the backplane communication bus, and where the solar tracking algorithm uses both 1) an Ephemeris calculation, with local GPS position data of the two axis tracker mechanism from a global positioning circuit that is part of the integrated electronics housing to determine angular coordinates that CPV cells contained in the solar array should be ideally positioned to relative to a current position of the Sun and 2) applies Kalman filtering that is continuously updated with power measurements over the time of an operation the two axis tracker assembly to create the offset matrix to results of the Ephemeris calculation, where the measured actual power output comes from the (I-V) curves taken off the inverter circuits.

16. The integrated electronics housing of claim 1, where a NEMA 3 chamber of the housing contains a set of fans fed by a filter that bring cooling from exterior to the housing, a set of heat sinks attached to the electronics circuits in the NEMA 4 chamber, and high heat generating components including a set of inductors for the inverter circuits; and a NEMA 4 chamber contains a high speed interface to integrate local weather station data through the high speed interface, which the weather data is then communicated to a central backend management system over an Internet.

17. The integrated electronics housing of claim 1, where metrology circuitry is contained inside the housing or fed over a wireless local area network for the site where the two axis tracker assembly is installed and includes at least receiving measurements from an anemometer, and
the metrology circuitry is configured when the anemometer detects high winds, a command is generated to place the solar array to go into wind stow mode.

18. A method for a two-axis tracker assembly having a CPV solar array; comprising:
operating an integrated electronics housing that contains both system electronics and power generation circuits for the two-axis tracker assembly having the CPV solar array, where the integrated electronics housing contains at least a communication bus, motion control circuits, and inverter circuits, and then acts as the local system control point for that two-axis solar tracker mechanism;
supplying three-phase AC voltage to a utility power grid interface transformer from the inverter circuits, where each inverter receives a bipolar DC voltage supplied from its own set of CPV cells;
moving the CPV cells of the two-axis solar tracker mechanism to angular coordinates resulting from a solar tracking algorithm with the motion control circuits; and
facilitating communications of information, including parameters of power being generated by the inverter circuits, between the motion control circuits and the AC inverter circuits via the communication bus in order to fine tune an AC power generated out of the two axis tracker mechanism.

19. The method of claim 18, further comprising:
detecting a ground fault with any the CPV cells from the solar array feeding a first inverter circuit, where the ground fault circuitry is contained within the housing and connects to the communication bus to send notice of a fault to both 1) the inverter circuit to activate its isolation contacts and 2) to a wireless circuit for reporting to the central management server, and
reporting measurements from performance monitoring circuitry contained in the motion control circuits, inverter circuits, and ground fault circuitry distributed, which provides remote measurements and notification of alarms in near real time to the central management server.

20. The method of claim 18, further comprising:
performing an Ephemeris calculation with a central processor in the housing using local GPS position data of the two axis tracker mechanism from a global positioning circuit that is part of the integrated electronics housing to determine angular coordinates that CPV cells contained in the solar array should be ideally positioned to relative to a current position of the Sun;
applying Kalman filtering that is continuously updated with power measurements over the time of an operation the two axis tracker assembly to create the offset matrix to the results of the Ephemeris calculation, where the measured actual power output comes from the (I-V) curves taken off the inverter circuits.

* * * * *